(12) United States Patent
Sakurada

(10) Patent No.: US 9,431,130 B2
(45) Date of Patent: Aug. 30, 2016

(54) MEMORY CONTROLLER, STORAGE DEVICE, AND MEMORY CONTROL METHOD

(71) Applicant: Kabushiki Kaisha Toshiba, Minato-ku (JP)

(72) Inventor: Kenji Sakurada, Yamato (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 111 days.

(21) Appl. No.: 14/337,372

(22) Filed: Jul. 22, 2014

(65) Prior Publication Data

US 2015/0256201 A1 Sep. 10, 2015

Related U.S. Application Data

(60) Provisional application No. 61/947,708, filed on Mar. 4, 2014.

(51) Int. Cl.

| | | |
|---|---|---|
| *G11C 16/26* | (2006.01) | |
| *G11C 29/02* | (2006.01) | |
| *G11C 29/50* | (2006.01) | |
| *H03M 13/00* | (2006.01) | |
| *H03M 13/11* | (2006.01) | |
| *H03M 13/37* | (2006.01) | |

(52) U.S. Cl.
CPC ........ *G11C 29/50004* (2013.01); *G11C 29/021* (2013.01); *G11C 29/028* (2013.01); *H03M 13/1111* (2013.01); *H03M 13/3715* (2013.01); *H03M 13/3723* (2013.01); *H03M 13/6325* (2013.01); *G11C 16/26* (2013.01)

(58) Field of Classification Search
CPC .......... G11C 29/50004; G11C 29/021; G11C 29/028; G11C 16/3404; G11C 16/26; H03M 13/6325; H03M 13/3723; H03M 13/3715; H03M 13/1111; H03M 13/2918; H03M 13/2927; H03M 13/45
USPC ......................................... 714/763
See application file for complete search history.

(56) References Cited

U.S. PATENT DOCUMENTS

| 8,156,398 | B2 | 4/2012 | Sommer et al. | |
|---|---|---|---|---|
| 8,990,665 | B1 * | 3/2015 | Steiner ................ | G11C 11/5642 714/769 |
| 2010/0124112 | A1 | 5/2010 | Kasuga | |
| 2011/0161775 | A1 | 6/2011 | Weingarten | |
| 2013/0077400 | A1 | 3/2013 | Sakurada | |
| 2015/0149871 | A1 * | 5/2015 | Chen ................... | G06F 11/1068 714/773 |

FOREIGN PATENT DOCUMENTS

| JP | 2010-123192 | 6/2010 |
|---|---|---|
| JP | 2013-80450 | 5/2013 |

* cited by examiner

*Primary Examiner* — James C Kerveros
(74) *Attorney, Agent, or Firm* — Oblon, McClelland, Maier & Neustadt, L.L.P

(57) ABSTRACT

According to one embodiment, a memory controller includes a decoding unit. The decoding unit calculates a syndrome weight in an LDPC code using a codeword read out from a non-volatile memory. The memory controller instructs the non-volatile memory to perform readout using first and second read-out voltages, and determines the first read-out voltage as the optimal read-out voltage in the case where a first syndrome weight based on a read-out result at the first read-out voltage is equal to or less than a second syndrome weight based on a read-out result at the second read-out voltage.

10 Claims, 9 Drawing Sheets

FIG.2
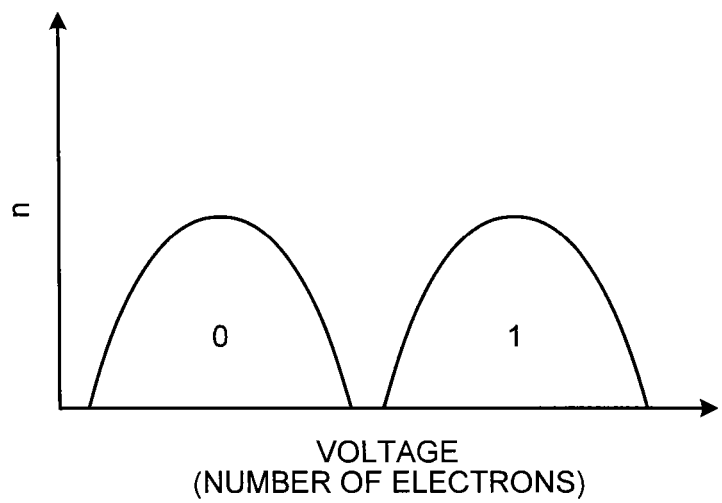
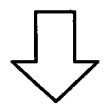
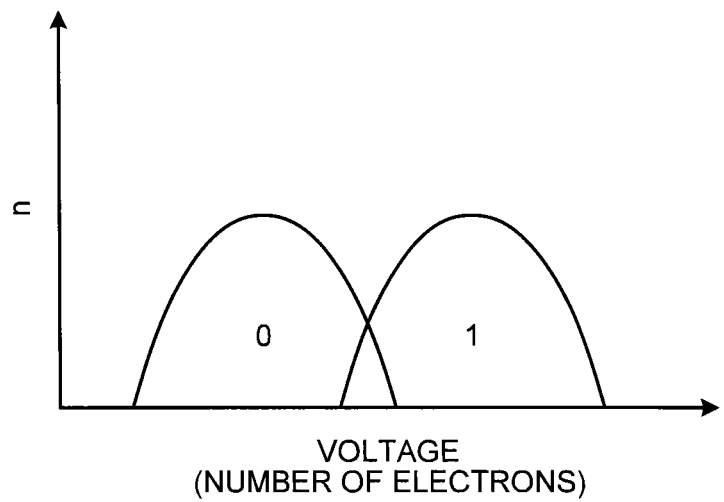

FIG.3

| | Vr₁ | Vr₂ | Vr₃ | Vr₄ | Vr₅ | Vr₆ | Vr₇ | |
|---|---|---|---|---|---|---|---|---|
| LLR Table (FOR DECODING) | -9 | -5 | -3 | -1 | 1 | 3 | 5 | 9 |
| LLR Table (FOR PARITY CHECK) | -1 | -1 | -1 | -1 | 1 | 1 | 1 | 1 |

US 9,431,130 B2

MEMORY CONTROLLER, STORAGE DEVICE, AND MEMORY CONTROL METHOD

CROSS-REFERENCE TO RELATED APPLICATIONS

This application is based upon and claims the benefit of priority from U.S. Provisional Application No. 61/947,708, filed on Mar. 4, 2014; the entire contents of which are incorporated herein by reference.

FIELD

Embodiments described herein relate generally to a memory controller, a storage device, and a memory control method.

BACKGROUND

In a NAND flash memory (hereinafter referred to as a NAND memory), information is stored by the electric charge amount stored in the floating gate of a memory cell. The stored information can be read out using a result of applying a voltage (read-out voltage) to the memory cell.

The distribution of the electric charge amount stored in the floating gate of the memory cell may change from the initial state. This may change the optimal read-out voltage (the read-out voltage with a few read-out errors).

BRIEF DESCRIPTION OF THE DRAWINGS

FIG. 2 is a diagram illustrating one example of change and distribution of a threshold voltage;

FIG. 3 is a diagram illustrating one example of an LLR Table;

DETAILED DESCRIPTION

In general, according to one embodiment, a memory controller includes a decoding unit. The decoding unit calculates a syndrome weight in an LDPC code using a codeword read out from a non-volatile memory. The codeword is coded by LDPC coding. The memory controller instructs the non-volatile memory to perform readout using first and second read-out voltages, and determines the first read-out voltage as the optimal read-out voltage in the case where a first syndrome weight calculated based on a read-out result at the first read-out voltage is equal to or less than a second syndrome weight calculated based on a read-out result at the second read-out voltage.

Exemplary embodiments of a memory controller, a storage device, and a memory control method will be explained below in detail with reference to the accompanying drawings. The present invention is not limited to the following embodiments.

First Embodiment

Figure 1:
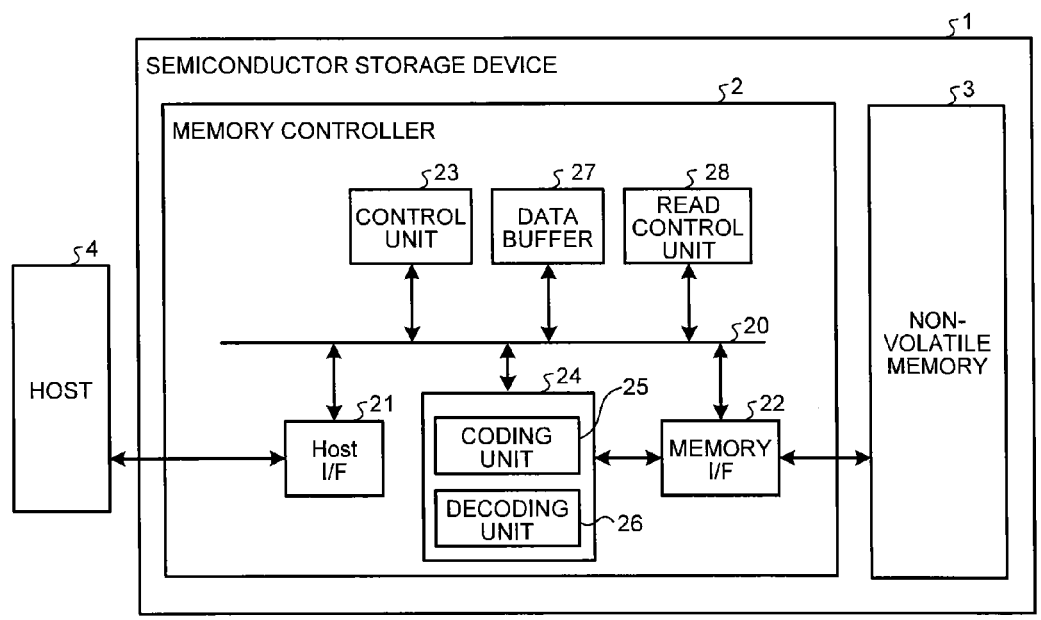
FIG. 1 is block diagram illustrating an exemplary configuration of a storage device according to a first embodiment.

FIG. 1 is a block diagram illustrating an exemplary configuration of a storage device (semiconductor storage device) according to a first embodiment. A semiconductor storage device 1 according to this embodiment includes a memory controller 2 and a non-volatile memory 3. The semiconductor storage device 1 can be coupled to a host 4. FIG. 1 illustrates the semiconductor storage device 1 in a state coupled to the host 4. The host 4 is, for example, an electronic device such as a personal computer and a mobile terminal.

The non-volatile memory 3 is a non-volatile memory that stores data in a non-volatile manner, for example, a NAND memory. While an example using a NAND memory as the non-volatile memory 3 will be described here, the non-volatile memory 3 may be other than the NAND memory.

The memory controller 2 controls writing to the non-volatile memory 3 in accordance with a write command from the host 4. Additionally, the memory controller 2 controls readout from the non-volatile memory 3 in accordance with a read command from the host 4. The memory controller 2 includes a Host I/F 21, a memory I/F 22 (memory control unit), a control unit 23, a coding/decoding unit 24, a data buffer 27, and a read control unit 28 that are coupled to one another by an internal bus 20.

The Host I/F 21 outputs a command, user data (write data), and similar data received from the host 4 to the internal bus 20. Additionally, the Host I/F 21 transmits the user data read out from the non-volatile memory 3, the response from the control unit 23, and similar data to the host 4.

The memory I/F 22 controls a process for writing the user data and similar data to the non-volatile memory 3 and a process for readout from the non-volatile memory 3 based on instructions from the control unit 23.

The coding/decoding unit 24 includes a coding unit 25 and a decoding unit 26. The coding unit 25 codes the user data to generate a codeword. The decoding unit 26 decodes the codeword. The details of coding and decoding according to this embodiment will be described later. The coding method performed by the coding/decoding unit 24 can employ low density parity check (LDPC) coding. This coding method is not limited to this insofar as the coding method is a method for calculating a syndrome weight similarly to the LDPC code.

The control unit 23 integrally controls the semiconductor storage device 1. The control unit 23 is, for example, a central processing unit (CPU), a micro processing unit (MPU), and similar processing unit. In the case where the control unit 23 receives a command from the host 4 via the Host I/F 21, the control unit 23 performs a control in accordance with this command. For example, in the case where the control unit 23 receives a write request from the host 4, the control unit 23 instructs the coding unit 25 to code the user data to be written. Additionally, the control unit 23 instructs the memory I/F 22 to write the codeword generated by the coding unit 25 to the non-volatile memory 3. In the case where the control unit 23 receives a read request from the host 4, the control unit 23 instructs the memory I/F 22 to read out the codeword from the non-volatile memory 3. Additionally, the control unit 23 instructs the decoding unit 26 to decode the codeword read out from the non-volatile memory 3. The control unit 23 manages a write destination (a physical address on the non-volatile memory 3) on the non-volatile memory 3 of the codeword.

The data buffer 27 temporarily stores the user data received from the host 4 until this data is stored in the non-volatile memory 3, and temporarily stores the data read out from the non-volatile memory 3 until this data is transmitted to the host 4. The data buffer 27 is constituted of, for example, a general-purpose memory such as a static random access memory (SRAM) and a dynamic random access memory (DRAM).

The read control unit 28 controls a process for selecting the optimal read-out voltage described later. FIG. 1 illustrates the exemplary configuration where the memory controller 2 includes the respective coding/decoding unit 24 and memory I/F 22. However, the coding/decoding unit 24 may be incorporated in the memory I/F 22. The read control unit 28 may be incorporated in any of the memory I/F 22, the control unit 23, and the coding/decoding unit 24.

In the NAND memory, when the data is written, electrons are injected such that the number of electrons (the electric charge amount) in the floating gate corresponds to any of a plurality of distributions (threshold distributions) depending on the data value. Here, for ease of description, a description will be given of an example of 1 bit/cell where one memory cell stores 1 bit. In case of 1 bit/cell, any one of two distributions corresponds to "0" while the other corresponds to "1". In the case where a voltage is applied to the memory cell, applying a voltage equal to or more than the voltage value corresponding to the electric charge amount of this memory cell causes a flow of current while applying a voltage less than this voltage does not cause a flow of current. Accordingly, this voltage at the boundary is determined corresponding to the electric charge amount of the memory cell for each memory cell. This voltage determined corresponding to the electric charge amount of the memory cell is referred to as a threshold voltage. Accordingly, in the initial state, the electric charge is injected corresponding to any of the two threshold distributions. During readout, applying the reference read-out voltage that separates the two threshold distributions to the memory cell allows determining whether or not the data stored in the memory cell is 1.

On the other hand, in the NAND memory, there are error factors of a data retention error, a read disturb error, a program disturb failure, and similar error. These error factors cause change in electric charge amount in the floating gate. Accordingly, readout using the initially set reference read-out voltage may cause a read error.

FIG. 2 is a diagram illustrating one example of change and distribution of the threshold voltage. The diagram on the upper side in FIG. 2 illustrates a distribution in the initial state. The vertical axis denotes a frequency (n). The horizontal axis denotes a threshold voltage (equivalent to the number of electrons in the floating gate). The peak on the left side denotes the distribution corresponding to "0". The peak on the right side denotes the distribution corresponding to "1". In the initial state, assuming that the read-out voltage is, for example, intermediate between the two distributions, readout can be performed without error. The diagram on the lower side in FIG. 2 illustrates a state where the distributions have changed. When the distributions thus change, readout using the read-out voltage in the initial state may cause an error.

To reduce the read errors, it is preferred to perform readout using the optimal read-out voltage corresponding to the distribution at that time point. Methods for searching the optimal read-out voltage include a method for performing readout using M numbers of the read-out voltages to obtain the number (frequency) of memory cells read out as the data value of "1". In this embodiment, this method is referred to as Vth Tracking. In the Vth Tracking, the number of memory cells present between two read-out voltages is obtained as a frequency. Using M numbers of the read-out voltages allows obtaining M+1 numbers of frequencies. Subsequently, a filter operation is performed on these M+1 numbers of frequencies to obtain the shapes of the peak and the valley of the distribution. Subsequently, the minimum value of this valley is set as the optimal read-out voltage.

However, for example, in the case where respective gradients of the skirts around the peak are different from each other in the right and left of the peak, the minimum value of the valley and the actual optimal read-out voltage with a few errors are shifted. In this embodiment, as described below, the optimal read-out voltage is selected using the syndrome weight of the LDPC code to set the optimal read-out voltage with a few read errors.

The memory controller 2 codes the user data using the LDPC code and stores the coded data in the non-volatile memory 3. The memory controller 2 performs readout by Soft Bit Read during decoding. The memory controller 2 can perform readout by Hard Bit Read and Soft Bit Read. The Hard Bit Read is a readout that uses one read-out voltage in one read-out process. The Soft Bit Read is a readout that uses a plurality of read-out voltages in one read-out process to output a determination value (HD data) and reliability information based on the result of applying the plurality of read-out voltages. The following describes an example where a log-likelihood ratio (LLR) is used as the reliability information. The LLR is input to the decoding unit 26 and the decoding unit 26 performs decoding using the input LLR.

The practical method of the Soft Bit Read is not limited, and any method may be used. For example, the Soft Bit Read is performed in the following procedure. When the control unit 23 of the memory controller 2 receives a read request from the host, the control unit 23 instructs the memory I/F 22 to read out the codeword of the read-out target from the non-volatile memory 3 by Soft Bit Read. The memory I/F 22 instructs the non-volatile memory 3 to read out the codeword by Soft Bit Read based on the instruction from the control unit 23. At this time, the number of readouts performed by Soft Bit Read may be specified. The non-volatile memory 3 applies a plurality of read-out voltages to the memory cell of the read-out target by Soft Bit Read based on the instruction from the memory I/F 22 and calculates the LLR based on these read-out results, so as to output the calculated result to the memory I/F 22.

For example, as the Soft Bit Read, readout is performed using seven read-out voltages in total of a read-out voltage (hereinafter referred to as an HB determination voltage) for determining the HB data and respective three read-out voltages on the lower voltage side and on the higher voltage side of this read-out voltage. In this case, the seven read-out voltages are applied to obtain the result (read-out result) whether or not the current flows. Subsequently, the non-volatile memory 3 calculates an Index indicative of the read-out result based on the read-out result of applying the seven read-out voltages. The calculation method for the Index is not limited. The memory controller 2 can acquire the read-out result (the result of applying the seven read-out voltages) based on the Index to calculate the LLR based on this read-out result. The method for calculating the LLR from the read-out result is not limited, and can calculate, for example, using a table (LLR Table).

FIG. 3 is a diagram illustrating one example of the LLR Table. FIG. 3 is a diagram illustrating one example of the LLR Table in the case where the Soft Bit Read is performed using seven read-out voltages ($Vr_1, Vr_2, \ldots, Vr_7$). The LLR Table (for decoding) illustrated on the upper side in FIG. 3 is an LLR Table used when decoding using the result of performing the Soft Bit Read is performed. Based on the read-out result by the seven read-out voltages, calculation is performed to determine which of eight regions of: a region with a read-out voltage smaller than $Vr_1$ (a region with a smaller electric charge amount of the memory cell than the electric charge amount corresponding to $Vr_1$); a region with a read-out voltage equal to or more than $Vr_1$ and smaller than $Vr_2$; ...; and a region with a read-out voltage equal to or more than $Vr_7$ is the state of each memory cell. Subsequently, the non-volatile memory 3 calculates the LLR corresponding to the region using the LLR Table for each memory cell. For example, in the case of the region with a read-out voltage equal to or more than $Vr_1$ and smaller than $Vr_2$, the calculated memory cell has HB data of "1" and an LLR of "−5". The LLR has the absolute value indicative of the degree of reliability, and has a higher reliability as the degree of reliability becomes higher. The respective positive and negative signs denote a higher state (on a side of the bit value of "0") and a lower state (on a side of the bit value of "1") with respect to the HB determination voltage.

Regarding the seven read-out voltages used for the Soft Bit Read, the non-volatile memory 3 may hold differences between: the respective three read-out voltages on the lower voltage side and on the higher voltage side of the HB determination voltage from the HB determination voltage, and the seven read-out voltages may be determined by specifying the HB determination voltage from the memory I/F 22. Alternatively, seven voltages may be specified from the memory I/F 22.

Generally, the non-volatile memory 3 does not output the read-out result as it is, but outputs the read-out result as the Index to reduce the number of bits as described above. However, the non-volatile memory 3 may output the read-out result as it is. While the above-described LLR Table (for decoding) illustrates the correspondence between the read-out result and the LLR, the memory controller 2 may hold the correspondence between the Index and the LLR as the LLR Table (for decoding).

The LLR output from the non-volatile memory 3 is input to the decoding unit 26. The decoding unit 26 performs decoding by iterative decoding algorithm using a Parity check matrix based on the LLR.

As described above, the decoding unit 26 has a function for performing a Parity check using a Parity check matrix to perform a process using a Parity check matrix in decoding. In this embodiment, the Hard Bit Read is performed a plurality of times while the read-out voltage is changed. Subsequently, a Parity check is performed based on the read-out results of the respective Hard Bit Reads. The optimal read-out voltage is determined based on the result of this Parity check.

Figure 4:
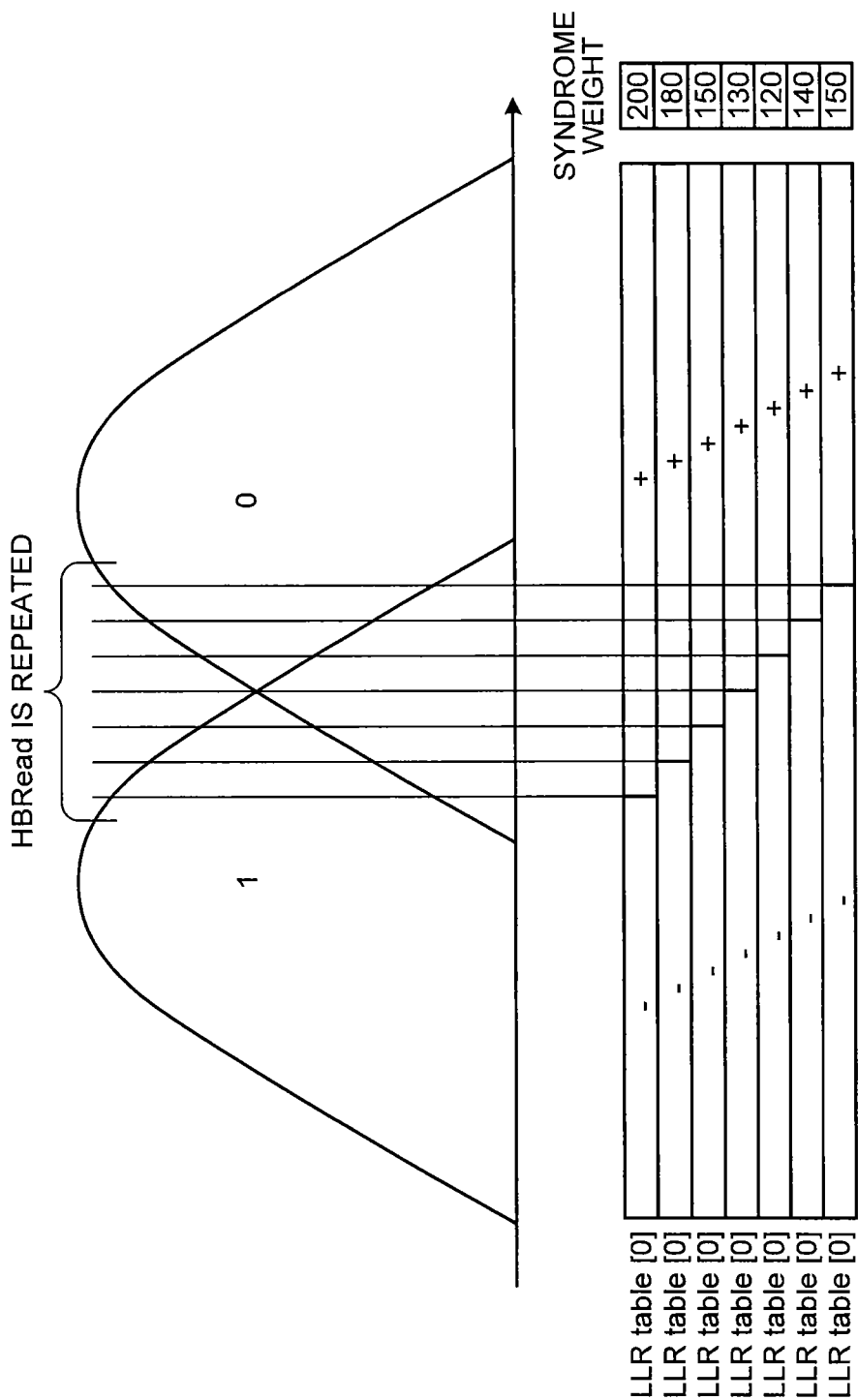
FIG. 4 is a diagram illustrating a concept of a plurality of times of Hard Bit Reads for the optimal read-out voltage according to the first embodiment.

FIG. 4 is a diagram illustrating a concept of a plurality of times of Hard Bit Reads for the optimal read-out voltage according to this embodiment. In the example of FIG. 4, the Hard Bit Read is performed seven times while the read-out voltage is changed. In this embodiment, the LLR is output from the non-volatile memory 3 as the read-out result in the Hard Bit Read similarly to the Soft Bit Read. In the seven Hard Bit Reads, the same LLR Table is used. The LLR Table used for these Hard Bit Reads may employ the above-described LLR Table (for decoding) used for the ordinary data readout. However, the process for determining the optimal read-out voltage is not performed until decoding is performed but the Parity check is performed alone. Accordingly, it is only necessary to find out the positive or negative sign of the LLR, that is, whether the read-out bit is 0 or 1. Accordingly, for example, the table as illustrated on the lower side in FIG. 3 may be used as a LLR Table for Parity check. While in FIG. 3 the absolute value of the LLR is set to 1, the absolute value of the LLR can be set to any value.

Figure 5:
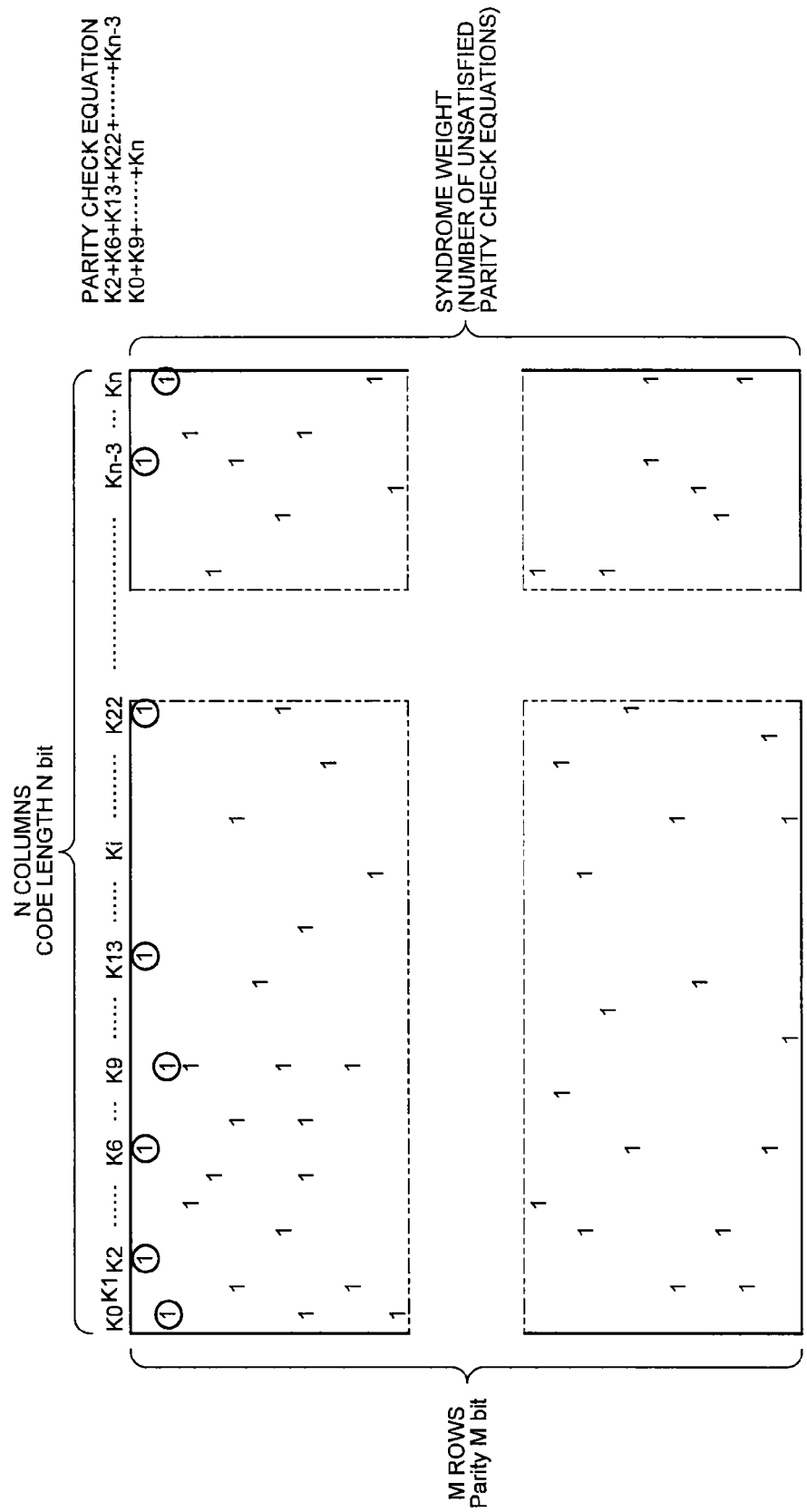
FIG. 5 is a diagram illustrating one example of a Parity check matrix.

Regarding the LDPC code, there are Parity check equations in the number corresponding to the data size of Parity (the number of Parity bits). These Parity check equations are expressed by a matrix as a Parity check matrix. Assuming that M denotes the number of Parity bits and N denotes the code length, the Parity check matrix is an M-row N-column matrix. FIG. 5 is a diagram illustrating one example of the Parity check matrix. The state where the Parity check equation is not satisfied (the value of the Parity check equation is not 0) shows existence of error. Accordingly, the larger number of Parity check equations are not satisfied, the higher possibility of the large amount of errors exist. Regarding the LDPC code, the number of unsatisfied Parity check equations among the M numbers of the Parity check equations is referred to as the syndrome weight.

In the readout for the optimal read-out voltage, when the bit values ("0" or "1") obtained from the input LLRs corresponding to one codeword are input, the decoding unit 26 does not perform the decoding and performs the Parity check so as to calculate the syndrome weight. That is, this Parity check matrix and a N-row 1-column matrix in which respective bit strings of the codeword read out from the non-volatile memory 3 are arranged in a longitudinal direction are multiplied together to obtain the calculation result of the respective Parity check equations. Subsequently, the syndrome weight is calculated based on this calculation result. Subsequently, the read-out voltage with the minimum syndrome weight is selected as the optimal read-out voltage.

The syndrome weight illustrated at the bottom right in FIG. 4 denotes an exemplary syndrome weight obtained for each readout by Hard Bit Read. In the example of FIG. 4, the fifth syndrome weight from the upper side is the minimum syndrome weight. Therefore, the fifth read-out voltage from the left side is selected as the optimal read-out voltage.

Here, the example where the non-volatile memory 3 outputs the LLR also in the Hard Bit Read has been described. However, it is only necessary to obtain the determination value of bits for selecting the optimal read-out voltage. Therefore, the non-volatile memory 3 may output the determination value of bits. Subsequently, this determination value of these bits may be used to perform a Parity check.

Figure 6:
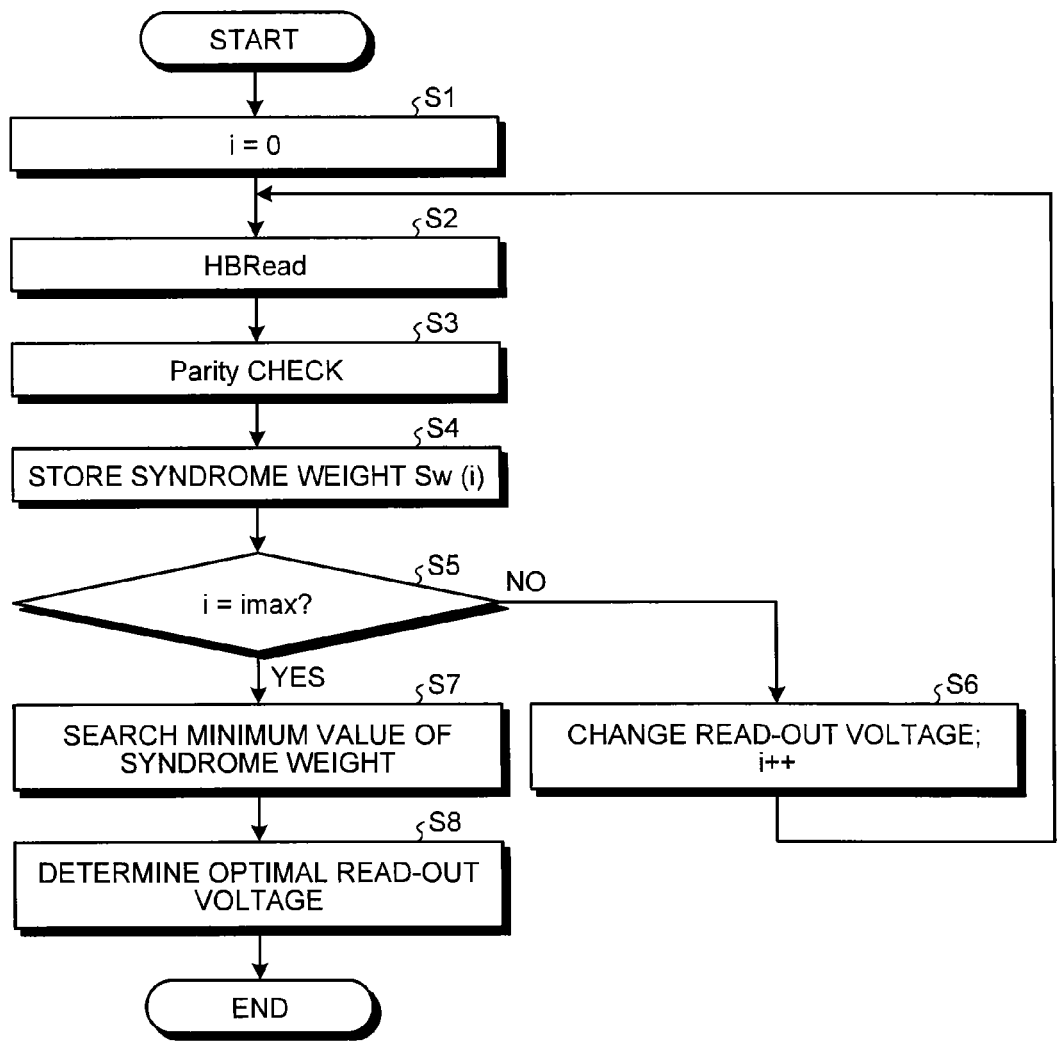
FIG. 6 is a flowchart illustrating one example of a calculation procedure for the optimal read-out voltage according to the first embodiment.

FIG. 6 is a flowchart illustrating one example of a calculation procedure for the optimal read-out voltage according to this embodiment. Firstly, the read control unit 28 performs initialization to set i=0 (in step S1). The read control unit 28 sets the read-out voltage to instruct the memory I/F 22 to perform the Hard Bit Read (HBRead) (in step S2). At this time, the number of codewords to be read out may be any number insofar as the number of codewords is equal to or more than 1. The memory I/F 22 performs readout based on the instruction. Subsequently, the decoding unit 26 uses the read-out result to perform a Parity check (in step S3). Subsequently, the decoding unit 26 obtains a syndrome weight Sw (i) and outputs the syndrome weight Sw (i) to the read control unit 28. The read control unit 28 stores the syndrome weight Sw (i) (in step S4).

The read control unit 28 determines whether or not i=imax (in step S5). Here, imax is the maximum value of i, and is the numerical value obtained by subtracting 1 from the number of readouts by Hard Bit Read. In the case where it is determined that i=imax is not satisfied (No in step S5), the read control unit 28 changes the read-out voltage and increments i by one (the step S6). Subsequently, the process returns to step S2.

In the case where it is determined that i=imax is satisfied (Yes in step S5), the read control unit 28 searches the minimum value of the stored syndrome weight Sw (i) from i=0 to i=imax (in step S7). Subsequently, the read control unit 28 determines the read-out voltage corresponding to the minimum value as the optimal read-out voltage (in step S8).

In the case where a plurality of codewords is read out, in steps S3 and S4, a Parity check is performed for each codeword to obtain the sum of the syndrome weights in each codewords.

With the above-described procedure, the optimal read-out voltages with a few read errors can be determined. Performing the subsequent readout from the non-volatile memory 3 using this read-out voltage allows reduction of the read errors.

As described above, in this embodiment, the Hard Bit Read is performed a plurality of times while the read-out voltage is changed. Subsequently, the result of readouts using the respective read-out voltages is used to calculate the syndrome weight by Parity check. Subsequently, the optimal read-out voltage is determined based on the syndrome weight. This allows setting the optimal read-out voltage with a few read errors. Additionally, the Parity check can be performed using the function for performing the Parity check in the ordinary decoding process. This realizes the above-described effects by simple addition of the function.

Second Embodiment

Next, a second embodiment will be described. In the first embodiment, the Hard Bit Read is performed a plurality of times. However, in this embodiment, the Hard Bit Read is performed one time to acquire the read-out result of a plurality of read-out voltages so as to obtain the syndrome weight. The configuration of the storage device 1 according to this embodiment is similar to that in the first embodiment.

As described in the first embodiment, in the Soft Bit Read, readout is performed using a read-out voltage used for bit determination and respective one or more read-out voltages on the lower voltage side and on the higher voltage side of this read-out voltage. In the ordinary Soft Bit Read, a plurality of read-out voltages is applied in the non-volatile memory 3. In this plurality of readouts, the position of the read-out voltage used for bit determination is fixed and a common LLR Table is used. In this embodiment, the result obtained in one Soft Bit Read is transformed into a plurality of LLRs using a plurality of LLR Tables. Subsequently, this plurality of LLRs corresponds to the LLRs in the case where the read-out voltage used for bit determination is changed. Accordingly, respective syndrome weights using this plurality of LLRs are obtained to calculate the LLR Table in which the syndrome weight becomes minimum. Subsequently, the read-out voltage at the boundary in bit determination in this LLR Table is set as the optimal read-out voltage.

Figure 7:
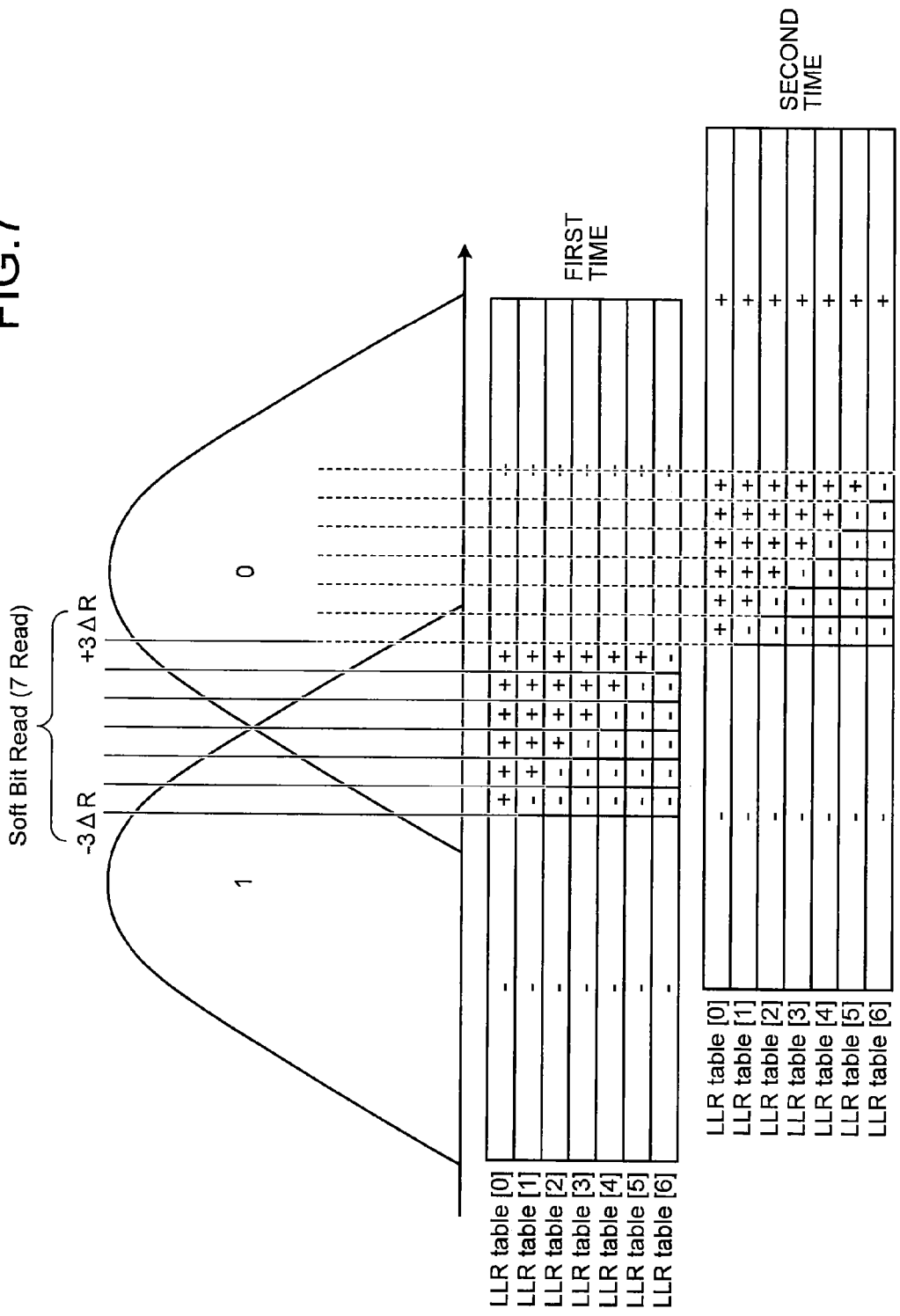
FIG. 7 is a diagram illustrating one example of switching between LLR Tables according to a second embodiment.

FIG. 7 is a diagram illustrating one example of switching between LLR Tables according to this embodiment. FIG. 7 illustrates an example where readout is performed seven times in one Soft Bit Read. In this embodiment, seven LLR Tables of an LLR table [0] to an LLR table [6] are prepared. The read control unit 28 uses one read-out result acquired from the non-volatile memory 3 to firstly calculate an LLR using the LLR table [0], subsequently calculate an LLR using the LLR table [1], . . . so as to calculate respective LLRs regarding the LLR table [0] to the LLR table [6]. Regarding the LLR Table to obtain the optimal read-out voltage in this embodiment, it is only necessary to find out only the positive or negative sign similarly to the first embodiment. In FIG. 7, it is only necessary to set any positive value in a portion with "+" and set any negative value in a portion with "−" in the LLR Table.

The respective boundaries between "+" and "−" are different from one another in the LLR table [0] to the LLR table [6]. The LLR table [0] in FIG. 7 has the lowest read-out voltage at the boundary between "+" and "−" among the read-out voltages in the seven Soft Bit Reads. That is, the lowest read-out voltage among the read-out voltages in the seven Soft Bit Reads is the voltage used as the reference of the bit determination (hard decision). The LLR table [1] has the second lowest read-out voltage at the boundary between "+" and "−" among the read-out voltages in the seven Soft Bit Reads. Similarly, in the LLR table [2] to the LLR table [6], each read-out voltage at the boundary between "+" and "−" is shifted by one read-out voltage toward the high voltage side.

In the case where the search range of the read-out voltage for obtaining the optimal read-out voltage is insufficient in one Soft Bit Read, the second Soft Bit Read may be performed to search the optimal read-out voltage like the example in FIG. 7. The number of Soft Bit Reads can be any number equal to or more than 1. For example, firstly, one Soft Bit Read is performed such that the lowest read-out voltage in the search range of the read-out voltage is included. Based on this result, in the case where the optimal read-out voltage is set to this highest read-out voltage set by Soft Bit Read, there is a possibility that the optimal read-out voltage is on the higher voltage side. Accordingly, in the case where the optimal read-out voltage is set to this highest read-out voltage set by Soft Bit Read, the second Soft Bit Read is performed in a region on a higher voltage side next to the first range as illustrated in FIG. 7 as the second result. Subsequently, based on the result of the second Soft Bit Read, in the case where the optimal read-out voltage is set to the highest read-out voltage set by this Soft Bit Read, the third Soft Bit Read is performed. The above-described process is repeated.

The method for calculating the respective LLRs corresponding to the LLR table [0] to the LLR table [6] may employ any method. For example, the non-volatile memory 3 outputs an Index, and the read control unit 28 acquires the read-out result from the Index. Subsequently, the read-out result and the LLR table [0] to the LLR table [6] can be used to calculate the LLRs corresponding to the respective LLR tables.

Alternatively, the non-volatile memory 3 may be configured to output the read-out result itself for each of the plurality of read-out voltages in one Soft Bit Read. The read control unit 28 of the memory controller 2 may use this read-out result to calculate respective LLRs using the LLR table [0] to the LLR table [6]. Alternatively, the non-volatile memory 3 may be configured to use a plurality of LLR tables in one Soft Bit Read so as to calculate the LLR. The memory controller 2 may acquire respective LLRs corresponding to the LLR table [0] to the LLR table [6] from the non-volatile memory 3.

With the above-described process, the memory controller 2 can acquire, in one Soft Bit Read, a plurality of LLRs equivalent to those in the case where the Hard Bit Read described in the first embodiment is performed a plurality of times. The process for calculating the syndrome weight using the LLR so as to obtain the optimal read-out voltage is similar to that in the first embodiment.

Figure 8:
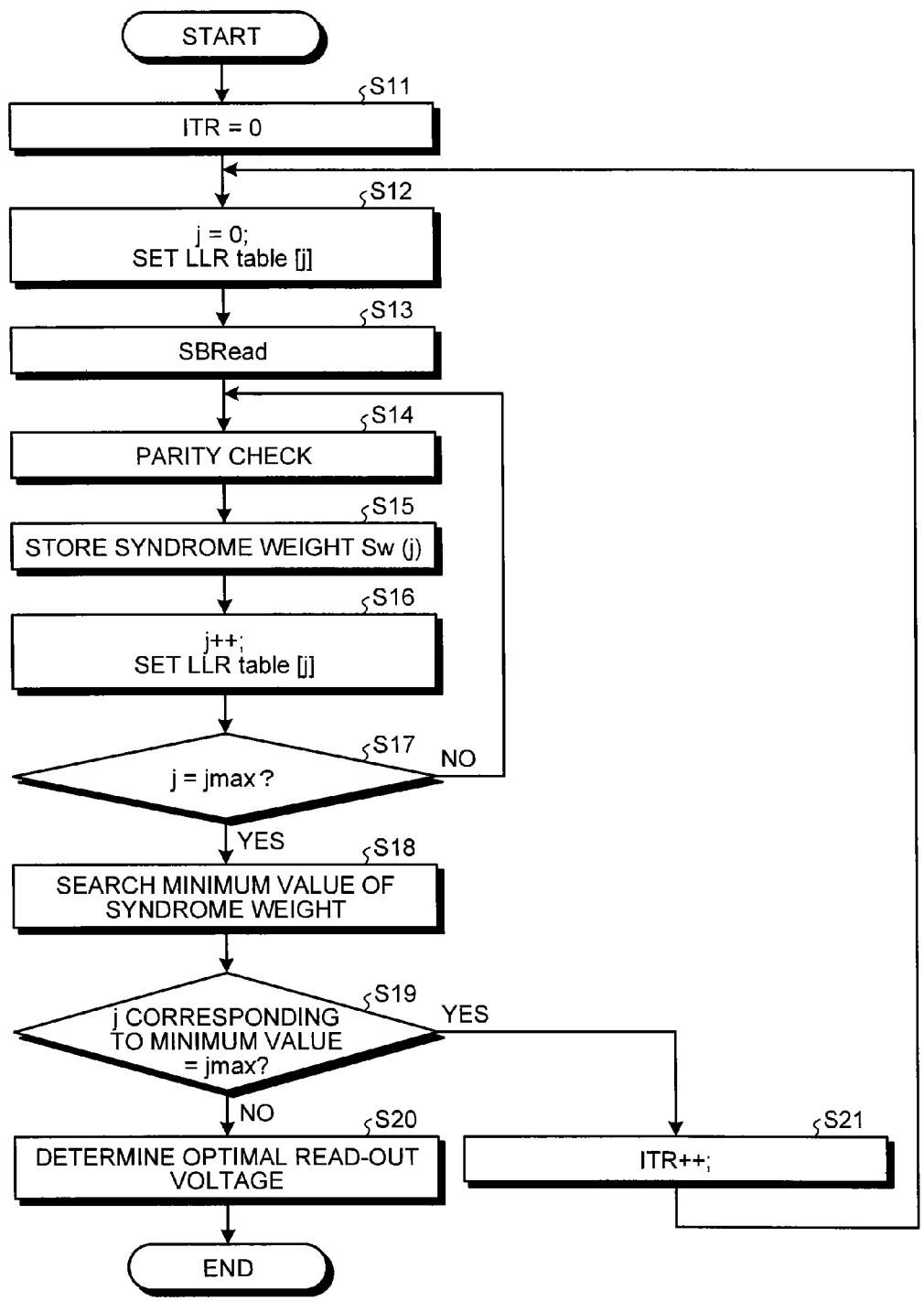
FIG. 8 is a flowchart illustrating one example of a calculation procedure for the optimal read-out voltage according to the second embodiment.

FIG. 8 is a flowchart illustrating one example of a calculation procedure for the optimal read-out voltage according to this embodiment. The read control unit 28 performs initialization to set ITR, which is a variable indicative of the number of executions of the Soft Bit Read, as ITR=0 (in step S11). The read control unit 28 performs initialization to set j, which is a variable indicative of the number of LLR tables, as j=0 and set an LLR table [j] (in step S12). The read control unit 28 instructs the memory I/F 22 to perform the Soft Bit Read (SBRead) (in step S13). At this time, the number of codewords to be read out may be any number equal to or more than 1. The memory I/F 22 performs readout based on the instruction. The read control unit 28 obtains an LLR using the read-out result (or the Index) from the non-volatile memory 3 and the LLR table [j]. The decoding unit 26 performs a Parity check using the LLR (in step S14). Subsequently, the decoding unit 26 obtains a syndrome weight Sw (j) and outputs the syndrome weight Sw (j) to the read control unit 28. The read control unit 28 stores the syndrome weight Sw (j) (in step S15).

Subsequently, the read control unit 28 increments j by one and sets the LLR table [j] (in step S16). The read control unit 28 determines whether or not j=jmax (in step S17). Here, jmax is the maximum value (obtained by subtracting 1 from the number of LLR tables) of j. In the case where it is determined that j=jmax is not satisfied (No in step S17), the process returns to step S14.

In the case where it is determined that j=jmax is satisfied (Yes in step S17), the minimum value of the stored syndrome weight Sw (j) from j=0 to j=jmax is searched (in step S18). Subsequently, the read control unit 28 determines whether or not j corresponding to the minimum value is equal to jmax (in step S19). In the case where it is determined that j corresponding to the minimum value is not equal to jmax (No in step S19), the read-out voltage corresponding to the minimum value is determined as the optimal read-out voltage (in step S20) and then the process terminates.

In the case where it is determined that j corresponding to the minimum value is equal to jmax (Yes in step S19), ITR is incremented by 1 to change the read-out voltage at the center in the Soft Bit Read (in step S21) and then the process returns to step S12.

In this embodiment, the single-level cell that stores 1 bit in one memory cell has been described. However, similarly in the case where a multi-level cell that stores a plurality of bits in one memory cell is used, the syndrome weight can be used to obtain the optimal read-out voltage. In the multi-level cell, assuming that the number of bits that can be stored in one memory cell is k bits, the value of data to be stored is associated with the distribution of $2^k$. Accordingly, there are $2^k-1$ numbers of read-out voltages. For these $2^k-1$ numbers of read-out voltages, respective values (the threshold values corresponding to the initial state on the upper side in FIG. 2) as the reference are determined. The $2^k-1$ patterns of read-out voltages might have the optimal read-out voltages that are different from the respective references. Accordingly, it is only necessary to obtain the optimal read-out voltage using the syndrome weight for each read-out voltage similarly to the case of the single-level cell.

As described above, in this embodiment, the read-out result of the Soft Bit Read is used to determine the optimal read-out voltage based on the syndrome weight in one Soft Bit Read similarly to the case where a plurality of Hard Bit Reads is performed. While in the Hard Bit Read described in the first embodiment the read-out operation is performed for each Hard Bit Read, in this embodiment, one read-out operation allows acquiring the LLRs equivalent to the LLRs obtained by a plurality of times of Hard Bit Reads. This allows reduction in processing time compared with the first embodiment.

Third Embodiment

Next, a third embodiment will be described. In the first embodiment and the second embodiment, the method for determining the optimal read-out voltage using the syndrome weight has been described. In this embodiment, a description will be given of a method for selecting the optimal read-out voltage using both the method using the syndrome weight and the Vth Tracking. The configuration of the storage device 1 according to this embodiment is similar to that in the first embodiment.

Figure 9:
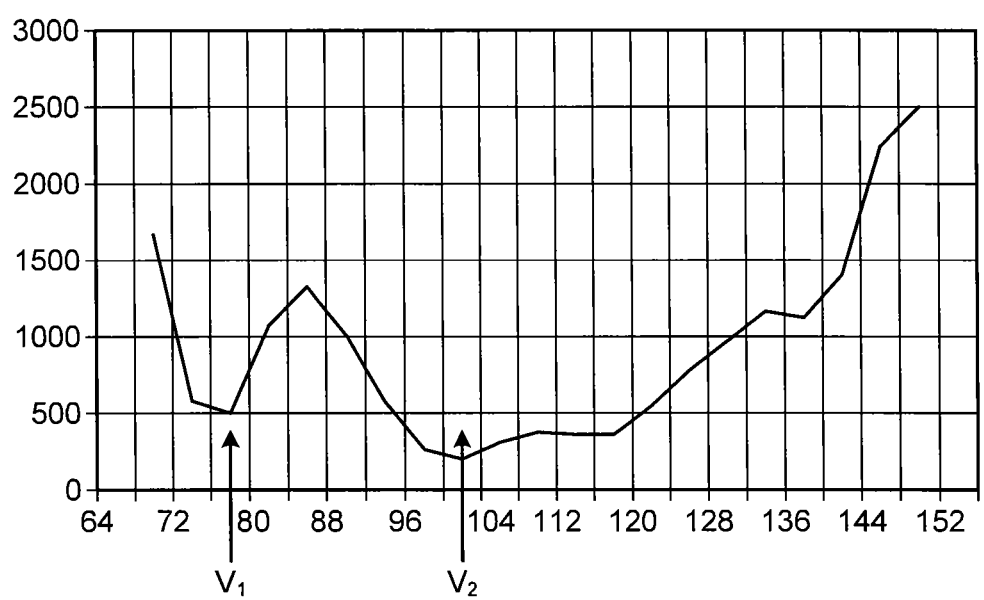
FIG. 9 is a graph illustrating one example of the shape of a distribution obtained by Vth Tracking.

FIG. 9 is a graph illustrating one example of the shape of a distribution obtained by Vth Tracking. The horizontal axis denotes a threshold voltage. The vertical axis denotes a frequency. FIG. 9 illustrates one example of the shape of the distribution after a filter operation is performed. As illustrated in FIG. 9, the shape of the distribution may have a plurality of valleys. The threshold voltages to be the minimum values (the bottom of the valley) of the respective valleys are denoted as $V_1$ and $V_2$. Thus, in the case where there is a plurality of valleys due to the Vth Tracking, the threshold voltages corresponding to the respective minimum values are set as the optimal candidates of the read-out voltage. The readout is performed for each of the optimal candidate to obtain the LLRs so as to calculate the syndrome weights based on the LLRs, similarly to the first embodiment. Subsequently, the optimal candidate with the small syndrome weight is selected as the optimal read-out voltage. Similarly in the case where there are three or more optimal candidates, the syndrome weights are calculated, and the optimal candidate with the minimum syndrome weight is selected as the optimal read-out voltage.

In contrast, assume that a plurality of read-out voltages with the minimum syndrome is obtained by the process according to the first embodiment or the second embodiment. In this case, the Vth Tracking may be performed to determine the optimal read-out voltage from the plurality of read-out voltages based on the result of the Vth Tracking.

As described above, in this embodiment, the configuration allows both of determining the optimal read-out voltage by syndrome weight and determining the optimal read-out voltage by Vth Tracking. In the case where a plurality of candidates of the optimal read-out voltage can be obtained by one method, the optimal read-out voltage is selected from the plurality of candidates based on the other method. Accordingly, there is a higher possibility that the read-out voltage can appropriately be set compared with the case where one method is used. This allows reducing the generation of read errors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller for controlling a non-volatile memory storing a codeword coded by low density parity check (LPDC) coding, the memory controller comprising:
a decoding unit configured to calculate a syndrome weight in an LDPC code using the codeword read out from the non-volatile memory; and
a read control unit configured to instruct the non-volatile memory to read out the codeword using first and second read-out voltages,
wherein the read control unit instructs the non-volatile memory to perform readout using the first read-out voltage when a first syndrome weight is equal to or less than a second syndrome weight, the first syndrome weight being calculated by the decoding unit using the codeword read out at the first read-out voltage, the second syndrome weight being calculated by the decoding unit using the codeword read out at the second read-out voltage.

2. The memory controller according to claim 1, wherein the read control unit is configured to:
instruct the non-volatile memory to read out the codeword using two or more read-out voltages containing the first and second read-out voltages; and
instruct the non-volatile memory to perform readout using a read-out voltage where a syndrome weight for each of the read-out voltages is minimum as the read-out voltage.

3. The memory controller according to claim 2, wherein in a case where a plurality of the read-out voltages where the syndrome weights are minimum exists, the memory controller uses the plurality of the read-out voltages where the syndrome weights are minimum to perform readout from the non-volatile memory, counts a number of memory cells with electric charge amounts corresponding to the read-out voltage, and obtains valleys of distributions in the number of memory cells based on a result of the count to perform Vth Tracking for calculating a minimum value of the valleys, so as to determine a read-out voltage used for readout from the non-volatile memory based on a result of the Vth Tracking.

4. The memory controller according to claim 1, wherein the first and second read-out voltages are each used to perform a corresponding one of Hard Bit Read.

5. The memory controller according to claim 1, wherein the non-volatile memory is configured to output the codeword which is a log likelihood ratio (LLR).

6. The memory controller according to claim 1, wherein readout is performed with a plurality of read-out voltages containing the first and second read-out voltages in one Soft Bit Read, and the non-volatile memory is configured to output a codeword which is a log likelihood ratio (LLR) based on a read-out result using the plurality of read-out voltages.

7. The memory controller according to claim 1, wherein the read control unit holds a first log likelihood ratio (LLR) Table and a second LLR Table, the first and second LLR Tables corresponding to a first hard decision read-out voltage and a second hard decision read-out voltage, respectively, the first and second hard decision read-out voltages being determination references of a hard decision value, the first hard decision read-out voltage and the second hard decision read-out voltage being different from each other, the first and second LLR Tables each being a transformation table for transforming a read-out result with the plurality of read-out voltages into LLRs, and
the read control unit is configured to:
calculate an LLR using the first LLR Table based on a result of one Soft Bit Read to obtain the first syndrome based on the LLR; and
calculate an LLR using the second LLR Table based on the result of one Soft Bit Read to obtain the second syndrome based on the LLR.

8. The memory controller according to claim 1, wherein the memory controller is configured to:
use two or more read-out voltages to perform readout from the non-volatile memory; count a number of memory cells with electric charge amounts corresponding to the read-out voltage; and
obtain valleys of distributions in the number of memory cells based on a result of the count to perform Vth Tracking for calculating a minimum value of the valleys, and
wherein, in the Vth Tracking, a plurality of the minimum values of the plurality of valleys exists, the memory controller instructs the non-volatile memory to read out the codeword for each minimum value of the valleys so as to determine a read-out voltage used for readout from the non-volatile memory based on syndrome weights of the respective minimum values of the valleys.

9. A storage device, comprising:
a non-volatile memory storing a codeword coded by low density parity check (LDPC) coding;
a decoding unit configured to calculate a syndrome weight in an LDPC code using the codeword read out from the non-volatile memory; and
a read control unit configured to instruct the non-volatile memory to read out the codeword using first and second read-out voltages,
wherein the read control unit instructs the non-volatile memory to perform readout using the first read-out voltage when a first syndrome weight is equal to or less than a second syndrome weight, the first syndrome weight being calculated by the decoding unit using the codeword read out at the first read-out voltage, the second syndrome weight being calculated by the decoding unit using the codeword read out at the second read-out voltage.

10. A memory control method for controlling a non-volatile memory storing a codeword coded by low density parity check (LDPC) coding, the memory control method comprising:
calculating a syndrome weight in an LDPC code using the codeword read out from the non-volatile memory; and
instructing the non-volatile memory to read out the codewords using first and second read-out voltages;
wherein the first read-out voltage is used for readout from the non-volatile memory when a first syndrome weight is equal to or less than a second syndrome weight, the first syndrome weight being calculated using the codeword read out at the first read-out voltage, the second syndrome weight being calculated using the codeword read out at the second read-out voltage.

* * * * *